United States Patent
Matsushita et al.

(10) Patent No.: US 8,779,503 B2
(45) Date of Patent: Jul. 15, 2014

(54) NONVOLATILE SEMICONDUCTOR MEMORY

(75) Inventors: Daisuke Matsushita, Fujisawa (JP); Akira Takashima, Fuchu (JP)

(73) Assignee: Kabushiki Kaisha Toshiba, Tokyo (JP)

(*) Notice: Subject to any disclaimer, the term of this patent is extended or adjusted under 35 U.S.C. 154(b) by 50 days.

(21) Appl. No.: 13/424,544

(22) Filed: Mar. 20, 2012

(65) Prior Publication Data

US 2013/0056819 A1    Mar. 7, 2013

(30) Foreign Application Priority Data

Sep. 1, 2011   (JP) ................................. 2011-190781

(51) Int. Cl.
*H01L 29/792* (2006.01)

(52) U.S. Cl.
USPC ............ 257/324; 257/E21.422; 257/E21.423; 257/E29.309

(58) Field of Classification Search
None
See application file for complete search history.

(56) References Cited

U.S. PATENT DOCUMENTS

| 7,804,128 | B2 | 9/2010 | Ariyoshi et al. | |
|---|---|---|---|---|
| 7,842,996 | B2 | 11/2010 | Kikuchi et al. | |
| 2007/0132004 | A1* | 6/2007 | Yasuda et al. | 257/315 |
| 2008/0197403 | A1* | 8/2008 | Ozawa et al. | 257/321 |
| 2008/0315288 | A1* | 12/2008 | Kikuchi et al. | 257/321 |
| 2009/0057750 | A1* | 3/2009 | Takashima et al. | 257/321 |
| 2009/0057751 | A1* | 3/2009 | Ariyoshi et al. | 257/321 |
| 2010/0072535 | A1* | 3/2010 | Takashima et al. | 257/324 |
| 2010/0163957 | A1* | 7/2010 | Yaegashi | 257/316 |
| 2010/0255671 | A1* | 10/2010 | Ishida et al. | 438/593 |

FOREIGN PATENT DOCUMENTS

| JP | 2006-203200 | 8/2006 |
|---|---|---|
| JP | 2007-134681 | 5/2007 |
| JP | 2009-54868 | 3/2009 |

* cited by examiner

*Primary Examiner* — Steven Loke
*Assistant Examiner* — Juanita B Rhodes
(74) *Attorney, Agent, or Firm* — Oblon, Spivak, McClelland, Maier & Neustadt, L.L.P.

(57) ABSTRACT

According to one embodiment, a nonvolatile semiconductor memory includes a semiconductor layer, a first insulating layer on the semiconductor layer, a charge storage layer on the first insulating layer, a second insulating layer on the charge storage layer, and a control gate electrode on the second insulating layer. The second insulating layer comprises a stacked structure provided in order of a first lanthanum aluminate layer, a lanthanum aluminum silicate layer and a second lanthanum aluminate layer from the charge storage layer side to the control gate electrode side.

20 Claims, 11 Drawing Sheets

NONVOLATILE SEMICONDUCTOR MEMORY

CROSS-REFERENCE TO RELATED APPLICATIONS

This application is based upon and claims the benefit of priority from prior Japanese Patent Application No. 2011-190781, filed Sep. 1, 2011, the entire contents of which are incorporated herein by reference.

FIELD

Embodiments described herein relate generally to a nonvolatile semiconductor memory.

BACKGROUND

In a cell transistor in which data is stored by charges in a charge storage layer, it is necessary to improve writing/erasing efficiency and lower the operating voltage to seek to improve reliability and lower power consumption. For this purpose, an increased coupling ratio and a decreased leakage current during writing/erasing need to be realized simultaneously.

DETAILED DESCRIPTION

In general, according to one embodiment, a nonvolatile semiconductor memory comprising: a semiconductor layer; a first insulating layer on the semiconductor layer; a charge storage layer on the first insulating layer; a second insulating layer on the charge storage layer; and a control gate electrode on the second insulating layer, wherein the second insulating layer comprises a stacked structure provided in order of a first lanthanum aluminate layer, a lanthanum aluminum silicate layer and a second lanthanum aluminate layer from the charge storage layer side to the control gate electrode side.

An embodiment will be described below with reference to the drawings.

1. Structure

A cell transistor such as a flash memory includes a stacked structure of a first insulating layer, a charge storage layer, a second insulating layer, and a control gate electrode on a semiconductor layer. If the capacitance between the semiconductor layer and the charge storage layer is Ctnl and the capacitance between the charge storage layer and the control gate electrode is Cipd, the coupling ratio CPR is represented as CPR=Cipd/(Ctnl+Cipd).

The writing/erasing efficiency is mostly determined by the coupling ratio CPR and thus, it is necessary to increase the coupling ratio CPR by making Cipd larger to improve the writing/erasing efficiency.

As the second insulating layer, for example, an insulating layer having a dielectric constant in the range of 3.9 to 10 such as $SiO_2$/high dielectric material/$SiO_2$, SiON/high dielectric material/SiON, $Si_3N_4$/$SiO_2$/high dielectric material/$SiO_2$/$Si_3N_4$, or $Si_3N_4$/SiON/high dielectric material/SiON/$Si_3N_4$ is used.

However, the increased coupling ratio CPR and the decreased leakage current during writing/erasing are in a trade-off relationship.

If, for example, a material as described above is used as the second insulating layer, it is difficult to obtain a sufficiently large coupling ratio CPR even if the second insulating layer is made as thin as possible within the limits of being able to suppress a leakage current during writing/erasing thanks to a finer structure of the cell transistor.

On the other hand, an increased coupling ratio CPR can also be realized by increasing an area where the charge storage layer and the control gate electrode are opposite to each other. If, for example, the charge storage layer of the cell transistor has a three-dimensional structure extending in the height direction and the top surface and side surface thereof are covered with the control gate electrode, the area where the charge storage layer and the control gate electrode are opposite to each other can be increased to make Cipd larger.

However, this technology has a problem of processing a charge storage layer. That is, by making the charge storage layer three-dimensional, a mass production margin is decreased, causing a problem of lower yields and increased manufacturing costs.

Thus, development of a new material (layer structure of the second insulating layer) that realizes an increased coupling ratio and a decreased leakage current during writing/erasing simultaneously even when the cell transistor has an ever finer structure is desired.

In an embodiment described below, a technology adopting a stacked structure of LAO/LASO/LAO for the second insulating layer will be proposed to solve the above problem.

LAO is lanthanum aluminate. The composition ratio of elements (La, Al, O) constituting LAO is not specifically limited, but La:Al being within the range of 2:1 to 1:4 is desirable because of stability and the most stable state ($LaAlO_3$) is more desirable. The dielectric constant of LAO can be controlled by the composition ratio thereof or the method of forming a film.

LASO is lanthanum aluminum silicate. The composition ratio of elements (La, Al, Si, O) constituting LASO is not specifically limited, but the most stable state (LaAlSiO) is desirable. The dielectric constant of LASO can also be controlled by the composition ratio thereof or the method of forming a film.

By adopting the structure, the leakage current during writing/erasing can sufficiently be decreased even if, for example, the electric field applied to LAO/LASO/LAO as the second insulating layer is 30 MV/cm or more. Accordingly, insulating properties, trap characteristics, and retention characteristics of the second insulating layer are improved. At the same time, the coupling ratio can be increased even if the cell transistor has an ever finer structure.

Figure 1:
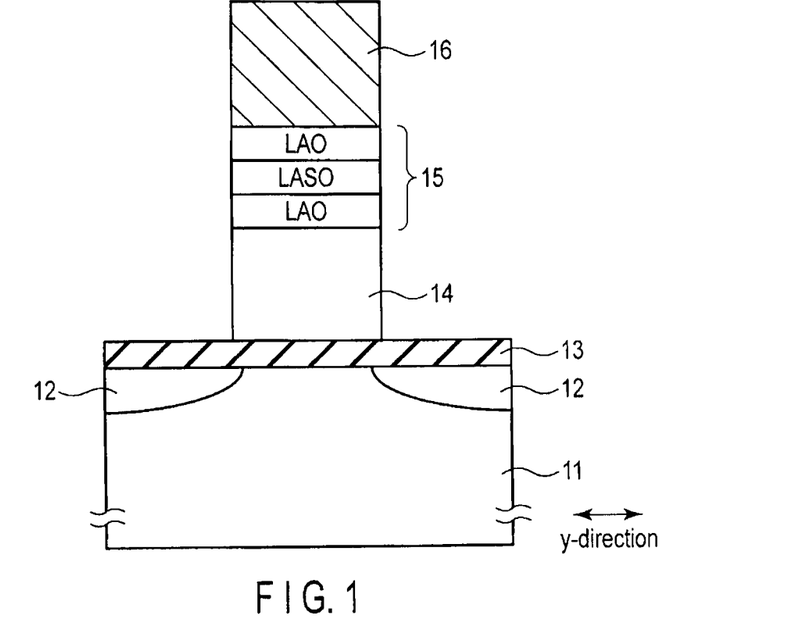
FIG. 1 is a diagram showing a basic structure of a cell transistor.

FIG. 1 shows a basic structure of a cell transistor,

Semiconductor layer (for example, a semiconductor substrate) 11 is, for example, silicon. Source/drain region 12 is arranged in a surface region of semiconductor layer 11. However, source/drain region 12 may be omitted. This is because if, for example, the distance between cell transistors that are serially connected becomes narrower like cell transistors of a NAND flash memory, a conduction path passing through the cell transistors can be generated without source/drain region 12 due to the fringe effect.

First insulating layer (tunnel insulating layer) 13 is arranged on semiconductor layer 11. Charge storage layer 14 is arranged on first insulating layer 13. Charge storage layer 14 is, for example, a floating gate electrode (conductive layer) in an electrically floating state. Charge storage layer 14 may also be a trap layer (insulating layer) that locally traps charges.

Second insulating layer 15 is arranged on charge storage layer 14. Control gate electrode 16 is arranged on second insulating layer 15.

Second insulating layer 15 has a three-layer structure (LAO/LASO/LAO). However, an interfacial layer may be present between charge storage layer 14 and LAO in the bottom layer and similarly, an interfacial layer may be present between control gate electrode 16 and LAO in the top layer.

Next, how the coupling ratio and the leakage current look like concretely will be simulated when the above basic structure is adopted.

The size of a cell transistor is increasingly becoming smaller due to demand of an increase in memory capacity in recent years, but the writing/erasing efficiency of the cell transistor can be made a sufficiently satisfactory value by making the coupling ratio CPR equal to 0.6 or more.

Thus, in the following simulation, further conditions for making the leakage current as small as possible under the assumption that the coupling ratio CPR is made equal to 0.6 or more will be presented.

Figure 2:
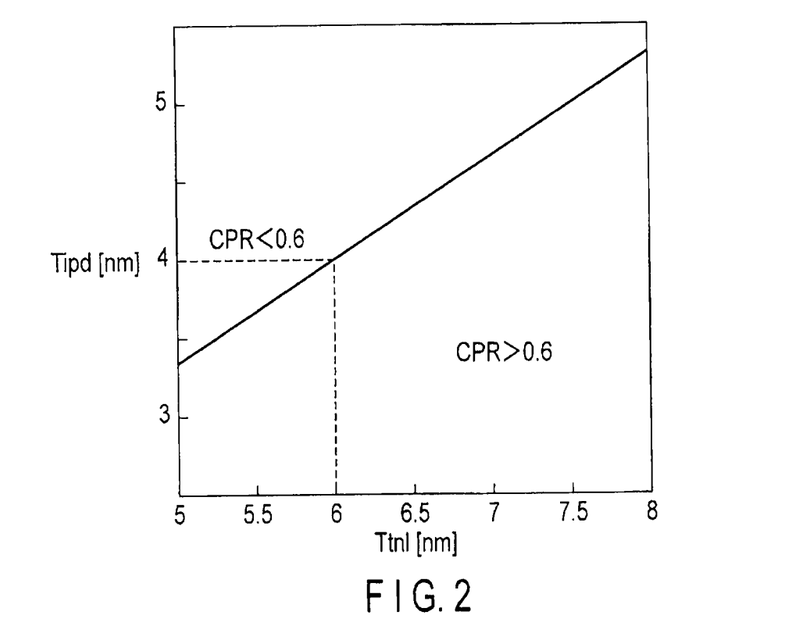
FIG. 2 is a diagram showing conditions for making a coupling ratio CPR equal to 0.6 or more.

FIG. 2 shows a relationship between an equivalent oxide thickness (EOT) of the first and second insulating layers in FIG. 1 and the coupling ratio.

It is assumed here that the cell transistor has the structure shown in FIG. 1 and the area where semiconductor layer 11 and charge storage layer 14 are opposed and the area where charge storage layer 14 and control gate electrode 16 are opposed are approximately equal (a so-called flat cell structure or a structure close thereto).

In this case, as shown in FIG. 2, the line where the coupling ratio CPR becomes 0.6 can be represented as a linear function (Ttnl=1.5×Tipd) of an equivalent oxide thickness Ttnl [nm] of the first insulating layer and an equivalent oxide thickness Tipd [nm] of the second insulating layer.

Thus, if the equivalent oxide thickness of the first insulating layer is Ttnl, the coupling ratio CPR equal to 0.6 or more can be realized by the equivalent oxide thickness of the second insulating layer of Tipd or less, where Tipd=(4/6)×Ttnl.

If it is necessary to use, for example, a silicon oxide (equivalent oxide thickness: 6 nm) of 6 nm as first insulating layer (tunnel insulating layer) 13, the coupling ratio CPR of 0.6 or more can be realized by setting the equivalent oxide thickness of second insulating layer (LAO/LASO/LAO) 15 to 4 nm or less.

Leakage characteristics of first insulating layer 13 will be described.

If first insulating layer 13 is a silicon oxide, it is necessary to make the physical thickness thereof equal to 6 nm or more so that a sufficiently satisfactory value is obtained as the leakage characteristics of first insulating layer 13. This is because if the equivalent oxide thickness of first insulating layer 13 is less than 6 nm, leakage characteristics of first insulating layer 13 are degraded and charge storage characteristics of charge storage layer 14 are aggravated.

Therefore, the equivalent oxide thickness of second insulating layer (LAO/LASO/LAO) 15 may always be made equal to 4 nm or less if, for example, the equivalent oxide thickness of first insulating layer 13 being equal to 6 nm or more and the coupling ratio CPR being equal to 0.6 or more should be satisfied simultaneously.

Incidentally, the equivalent oxide thickness of first insulating layer 13 is desirably 7.5 nm or less. This is intended to lower a program voltage Vpgm when charges are injected into charge storage layer 14.

If, for example, the equivalent oxide thickness of first insulating layer (silicon oxide) 13 is set to 7.5 nm and the coupling ratio CPR of the cell transistor is set to 0.6, it is necessary to apply 12.5 V (=7.5 [nm]×10 [MV/cm]/0.6) to control gate electrode 16 to apply 10 MV/cm to first insulating layer 13. However, this assumes a state (for example, an erase state) in which no charge is stored in charge storage layer 14.

If a case when a neutral threshold (intermediate threshold between a threshold in an erase state and a threshold in a writing state) of the cell transistor is −2 V and the potential of charge storage layer 14 is 2 V should be considered, under the same conditions as above, it is necessary to apply 19.1 V (=(7.5 [nm]×10 [MV/cm])+4 [V]/0.6) to control gate electrode 16 to apply 10 MV/cm to first insulating layer 13.

That is, if the equivalent oxide thickness of first insulating layer 13 is 7.5 nm, it is necessary to set the program voltage Vpgm to 19.1 V or more.

On the other hand, a disturbance of a non-select cell not to be written into will be considered.

The withstand voltage of the insulating layer between the control gate electrodes of two adjacent cell transistors (between two word lines) is about 8 MV/cm. Thus, if the interval (half pitch) between two word lines is about 10 nm, it is necessary to apply a transfer voltage Vpass of 11.1 V or more to the control gate electrode of a non-select cell (non-select word line) to limit a potential difference therebetween to 8 V or less. At this point, the electric field applied to first insulating layer 13 of the non-select cell is 8.8 MV/cm or more.

If, in this case, the time necessary to write data of one page is 1 msec, the tunnel current (leak) when the electric field of 8.8 MV/cm is applied to first insulating layer 13 is $1 \times 10^{-5}$ A/cm$^2$, the number of word lines in one block is 133, and the plane size of charge storage layer 14 is 10 nm×10 nm, the number of charges written into the non-select cell is $1 \times 10^{-5}$ [A/cm$^2$]×100 [nm$^2$]×1 [msec]/q×133=8 or more.

If the width of threshold changed by one charge is 100 mV, a program disturbance of about 0.8 V is generated in the non-select cell by eight charges. The tolerance of the disturbance changes depending on being binary/multi-valued or a margin between values, but generally for a binary memory, it is desirable to limit the tolerance to 0.8 V or less.

Therefore, it is very effective for stable operation of the cell transistor to lower the program voltage by making the equivalent oxide thickness of first insulating layer 13 equal to 7.5 nm or less to limit the disturbance of the non-select cell to 0.8 V or less.

Next, leakage characteristics of second insulating layer 15 will be described.

Second insulating layer 15 has a three-layer structure (LAO/LASO/LAO) and, as described above, the equivalent oxide thickness thereof is desirably made equal to 4 nm or less to make the coupling ratio CPR equal to 0.6 or more. Thus, how the relationship between the physical thickness of each layer and leakage characteristics of second insulating layer 15 looks like when the equivalent oxide thickness of second insulating layer 15 is set to 4 nm will be described below.

Table 1 shows samples (cell transistors) No. 1 to 11.

TABLE 1

|  | LAO (nm) | LASO (nm) | LAO (nm) |
| --- | --- | --- | --- |
| Sample No. 1 | 0 | 12.4 | 0 |
| Sample No. 2 | 1 | 11.1 | 1 |
| Sample No. 3 | 2 | 9.8 | 2 |
| Sample No. 4 | 3 | 8.6 | 3 |
| Sample No. 5 | 4 | 7.3 | 4 |
| Sample No. 6 | 5 | 6 | 5 |
| Sample No. 7 | 6 | 4.8 | 6 |
| Sample No. 8 | 7 | 3.5 | 7 |
| Sample No. 9 | 8 | 2.2 | 8 |
| Sample No. 10 | 9 | 1 | 9 |
| Sample No. 11 | 9.75 | 0 | 9.75 |

In the samples No. 1 to 11, the equivalent oxide thickness of second insulating layer (LAO/LASO/LAO) 15 is 4 nm. While dielectric constants of LAO and LASO can be controlled by the composition ratio or the like, it is assumed here that the dielectric constant of LAO is 19 and the dielectric constant of LASO is 12.

Figure 3:
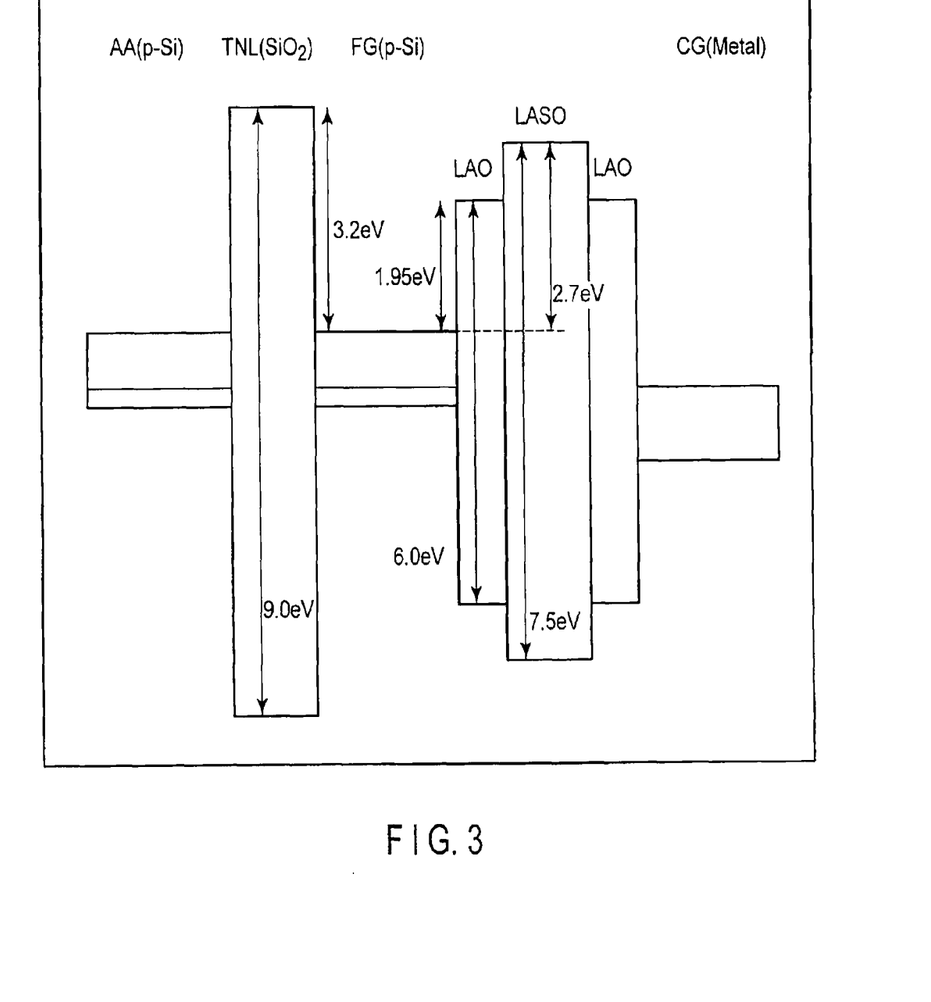
FIG. 3 is a diagram showing a band structure of the cell transistor.

It is also assumed that energy bands of the samples No. 1 to 11 are set as shown in FIG. 3. For example, a semiconductor layer (active area) AA is p-type silicon (p-Si), a first insulating layer (tunnel insulating layer) TNL is a silicon oxide ($SiO_2$), a charge storage layer FG is a p-type silicon (p-Si), and a control gate electrode CG is a metal. It is assumed that the energy gap between LAO and the charge storage layer FG is 1.95 eV.

Table 1 shows the physical thickness of each layer of the three-layer structure (LAO/LASO/LAO) under the above conditions.

Figure 4:
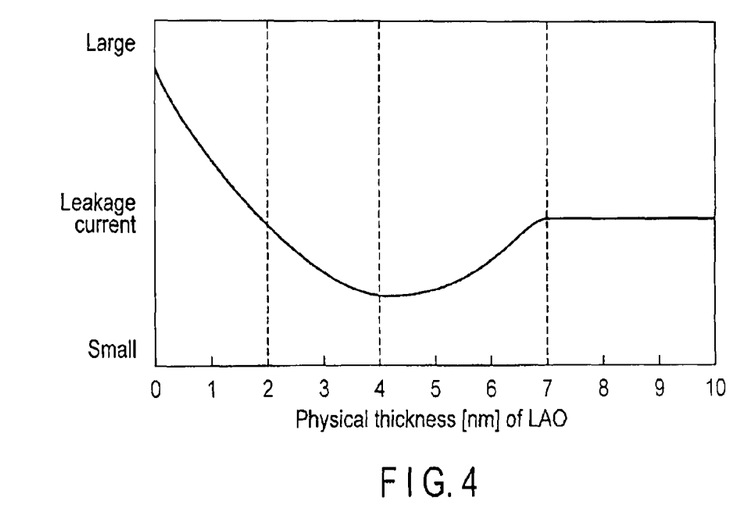
FIG. 4 is a diagram showing a relationship between a physical thickness of LAO and a leakage current.

FIG. 4 shows leakage current characteristics of the samples No. 1 to 11 when the electric field applied to the second insulating layer is 30 MV/cm.

According to the leakage current characteristics, when the physical thickness of LAO is in the range of 2 nm to 7 nm, the leakage current in the second insulating layer is smaller than the leakage current generated in a single layer (sample No. 1) of LASO and a single layer (sample No. 11) of LAO. That is, an increased coupling ratio and a decreased leakage current during writing/erasing can be realized simultaneously by adopting the three-layer structure (LAO/LASO/LAO) for the second insulating layer.

The leakage current is minimum when the physical thickness of LAO is 4 nm (sample No. 5) and the value thereof is smaller than the leakage current generated in the LAO single layer (sample No. 11) by an order of magnitude or more.

Therefore, if a cell transistor is formed by setting the physical thickness of LAO to 4 nm or the range of 3 to 5 nm, the leakage current during writing/erasing can be minimized and even if manufacturing variations occur, the leakage current will not be larger than the leakage current of the LAO single layer due to a sufficient margin.

Incidentally, the lower limit of the physical thickness of LAO to obtain an effect of reducing the leakage current is 2 nm (sample No. 3). In this case, the physical thickness of LASO is 9.8 nm and the physical thickness of the second insulating layer is 13.8 nm.

The upper limit of the physical thickness of LAO to obtain an effect of reducing the leakage current is 7 nm (sample No. 8). In this case, the physical thickness of LASO is 3.5 nm and the physical thickness of the second insulating layer is 17.5 nm.

Therefore, the range of the physical thickness of the second insulating layer corresponding to the range (2 nm to 7 nm) of the physical thickness of LAO is 13.8 nm or more and 17.5 nm or less.

This effect results from the fact that the potential barrier when a charge in the charge storage layer is about to leak to the control gate electrode is two layers of LAO and LASO.

The electric field applied to LAO becomes smaller with an increasing physical thickness of LAO and when the physical thickness of LAO is 2 nm, the leakage current becomes smaller than the leakage current of the LAO single layer. The leakage current is minimum when the physical thickness of LAO is 4 nm and the value of the leakage current increases again if the physical thickness of LAO exceeds 4 nm. Then, when the physical thickness of LAO exceeds 7 nm, the potential barrier felt by charges in the charge storage layer becomes LAO only and the leakage current becomes the same as the leakage current of the LAO single layer.

From the foregoing, the leakage current generated in the second insulating layer during writing/erasing can be made smaller than the leakage current of the LASO single layer or the LAO single layer by further setting the physical thickness of LAO to a value in the range of 2 nm to 7 nm when the equivalent oxide thickness of second insulating layer 15 is 4 nm or less.

Incidentally, literatures report that an electronic barrier of LAO is 2.4 eV and the dielectric constant thereof is 25. As a result of verification in each case of changing the dielectric constant of LAO within the range of 19 to 25 and changing a work function of the charge storage layer within the range of 4.05 to 5.05 eV, results similar to the above results can be obtained.

However, if the dielectric constant of LAO is set to less than 19, insulating properties of the second insulating layer falls dramatically and thus, it is desirable to set the dielectric constant of LAO to 19 or more.

Next, a technology to reduce the leakage current during writing/erasing when the physical thickness of LAO exceeds 7 nm will be described.

According to FIG. 4, as already described, the leakage current of the second insulating layer is approximately the same as the leakage current of the LAO single layer if the equivalent oxide thickness of second insulating layer 15 is 4 nm or less or the physical thickness of LAO exceeds 7 nm.

This is because, as already described, if the physical thickness of LAO exceeds 7 nm, the potential barrier felt by charges in the charge storage layer is LAO only.

In such a case, the leakage current of the second insulating layer is made smaller than the leakage current of the LAO single layer by controlling the dielectric constant of LAO and the work function of the charge storage layer.

First, in FIG. 4, the leakage current of the LAO single layer (sample No. 11) when the electric field of 30 MV/cm is applied is 0.01 A/cm$^2$. Thus, the line (boundary) where the leakage current is 0.01 A/cm$^2$ is verified by changing the dielectric constant of LAO and the work function of the charge storage layer for the samples No. 9 and 10 in Table 1.

Figure 5:
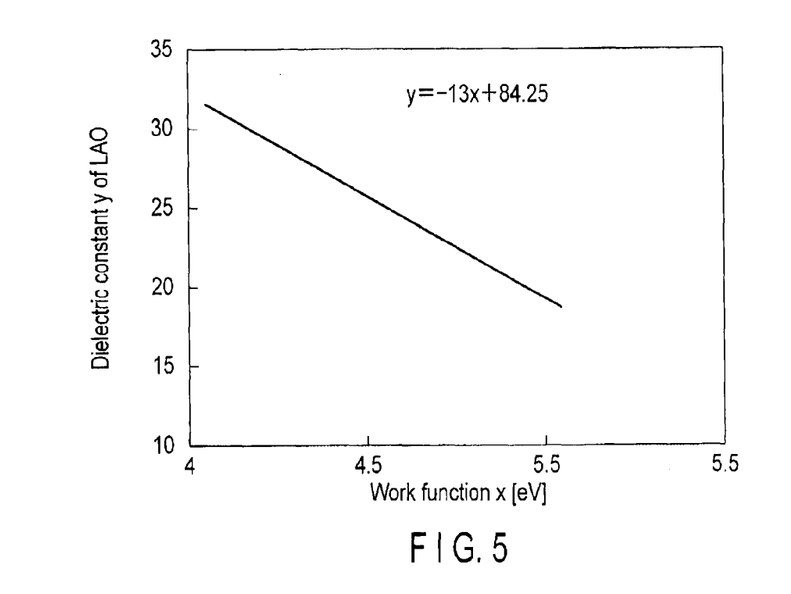
FIG. 5 is a diagram showing conditions for achieving the leakage current smaller than the leakage current of an LAO single layer.

If the work function of the charge storage layer is x and the dielectric constant of LAO is y, as shown in FIG. 5, the line is represented as $$y = -13x + 84.25 \tag{1}$$

Thus, the leakage current of the second insulating layer when the electric field of 30 MV/cm is applied is smaller than 0.01 A/cm$^2$ in the range of y>−13x+84.25 and larger than 0.01 A/cm$^2$ in the range of y<−13x+84.25.

Therefore, in the range in which the physical thickness of LAO exceeds 7 nm, it is desirable to reduce the leakage current during writing/erasing by setting y>−13x+84.25 as the relationship between the work function x of the charge storage layer and the dielectric constant y of LAO.

According to FIG. 5, the range of the dielectric constant y of LAO that achieves a leakage current smaller than 0.01 A/cm$^2$ is increased with an increasing work function x of the charge storage layer. Thus, it is desirable to form the charge storage layer from a material having a large work function.

For example, an effect of reducing the leakage current can be achieved by making the dielectric constant of LAO equal to 19 or more when the work function x of the charge storage layer is made equal to 5.05 eV or more. Also, an effect of reducing the leakage current can be achieved by making the dielectric constant of LAO equal to 26.4 or more when the work function x of the charge storage layer is made equal to 4.45 eV or more. Pt, TaN, Hf, MoN, Ni, Pd, and Au can be cited as materials that make the work function x of the charge storage layer equal to 5.05 eV or more. Pt, TaN, Hf, MoN, Ni, Pd, Au, Wn, Re, W, NiSi, TiNCu, and WN can be cited as materials that make the work function x of the charge storage layer equal to 4.45 eV or more.

In the above description, silicon oxide is mainly used as the first insulating layer, but the first insulating layer is not limited to silicon oxide. For example, the first insulating layer may be silicon oxide doped with nitrogen or a stacked layer of silicon and silicon oxide. However, as described above, the equivalent oxide thickness of the first insulating layer is desirably in the range of 6 nm to 7.5 nm.

If the maximum writing threshold of the charge storage layer is Vthmax and the work function is y, a continuous level may be present in the range of 3.2 eV (electronic barrier of silicon oxide)+y−4.05 eV−CPR·Vthmax from a conductor in the first insulating layer (tunnel insulating layer).

This becomes an assist level when charges are moved from the charge storage layer to the semiconductor layer (channel). For example, if the equivalent maximum writing threshold from the charge storage layer is 4 V, the coupling ratio CPR is 0.6, and the work function is 4.05 eV, the potential of the charge storage layer becomes 2.4 V. If a continuous level is present in a position within 0.8 V from a conduction band edge of the first insulating layer, the interface state level on a channel side when viewed from the conduction band edge of the charge storage layer becomes 3.2−2.4=0.8 eV.

That is, the level is the same energy level as that of the conduction band of the charge storage layer and thus, the probability of tunneling of charges in the first insulating layer rises and charge holding properties are degraded. Therefore, the interface state level on the channel side when viewed from the conduction band edge of the charge storage layer is desirably set to 0.8 eV or less. If the work function of the charge storage layer is 5.05 eV, the level may be set to 3.2+5.05−4.05−0.6×4=1.8 eV or less.

Incidentally, the level inside the first insulating layer (tunnel insulating layer) may be formed by adding impurities such as Ge, N, C, and Si.

2. Manufacturing Method

The manufacturing method of the cell transistor in FIG. 1 will be described.

A memory cell array of the so-called flat cell structure in which the area where the semiconductor layer (channel) and the charge storage layer are opposed and the area where the charge storage layer and control gate electrode 16 are opposed are approximately equal is taken as an example.

FIGS. 6 to 16 are diagrams showing the manufacturing method of the cell transistor of the flat cell structure.

In these diagrams, the x direction and the y direction are parallel to the surface of semiconductor layer (for example, the semiconductor substrate) 11 and orthogonal to each other. The x direction is a direction in which control gate electrodes (word lines) 16a, 16b, 16c extend and is a direction parallel to the channel width of the cell transistor (FET: Field Effect Transistor). The y direction is a direction parallel to the channel length of the cell transistor.

Figure 6:
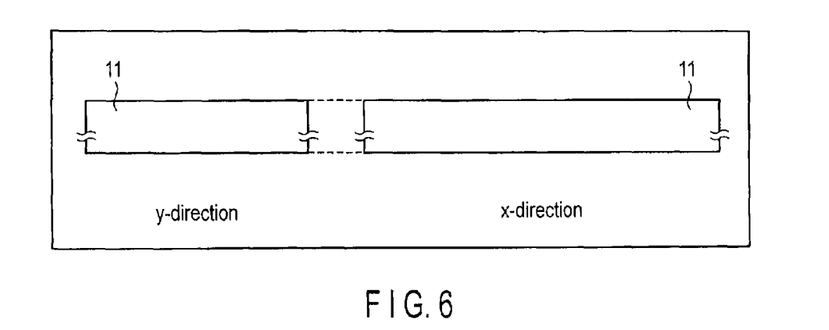
FIGS. 6 to 16 are diagrams showing a method of manufacturing the cell transistor.

First, as shown in FIG. 6, semiconductor layer 11 doped with impurities is treated with dilute fluoric acid to terminate the surface of semiconductor layer 11 by hydrogen. Also, hydrogen is completely eliminated from the surface of semiconductor layer 11 by setting the temperature of a chamber filled with a gas (for example, a nitrogen gas) that does not react with semiconductor layer 11 or does not etch semiconductor layer 11 to about 700° C.

Figure 7:
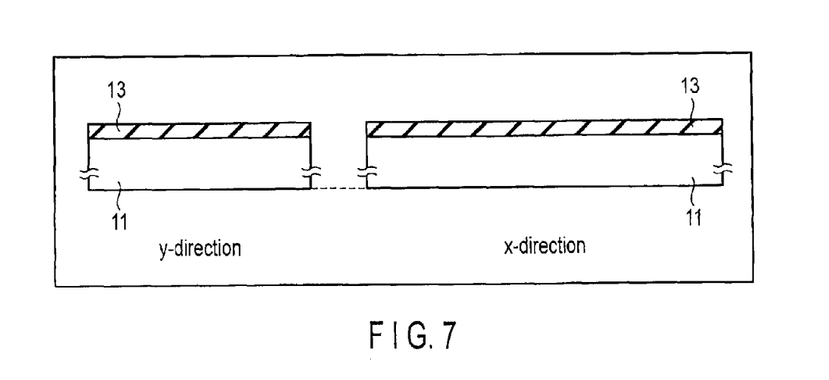
Figures 8, 9:
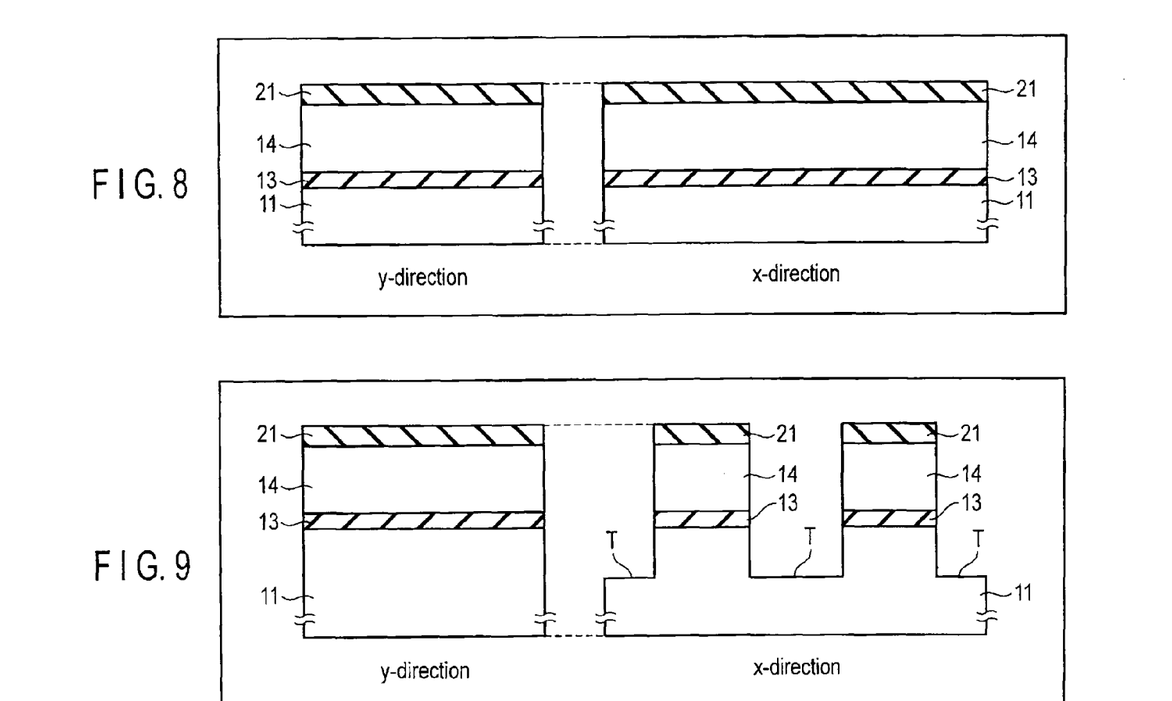

Next, as shown in FIG. 7, first insulating layer (for example, silicon oxide) 13 having the equivalent oxide thickness of 6 nm to 7.5 nm is formed on semiconductor layer 11 by the thermal oxidation method. Subsequently, as shown in FIG. 8, charge storage layer 14 and hard mask layer 21 are formed on first insulating layer 13 by CVD (Chemical Vapor Deposition). Charge storage layer 14 is, for example, boron doped polysilicon having the physical thickness of 5 nm to 10 nm.

Next, as shown in FIG. 9, hard mask layer 21 is patterned by PEP (Photo Engraving Process) and then, hard mask layer 21 is used as a mask to etch charge storage layer 14, first insulating layer 13, and semiconductor layer 11 by RIE (Reactive Ion Etching). As a result, an element isolation trench T is formed.

Figure 10:
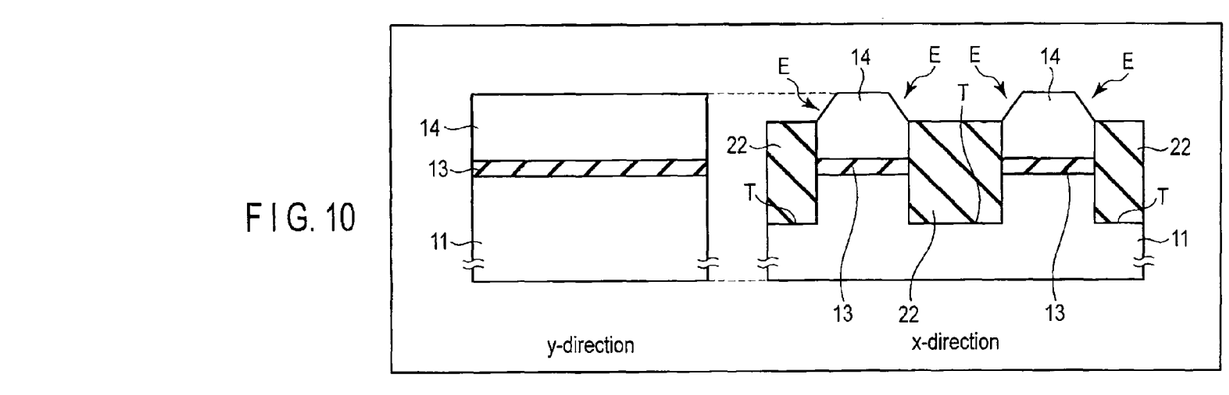

Next, as shown in FIG. 10, element isolation insulating layer (for example, silicon oxide) 22 completely filling the element isolation trench T is formed by the CVD method. If element isolation insulating layer 22 is polished by CMP (Chemical Mechanical Polishing) until hard mask layer 21 in FIG. 9 is exposed, element isolation insulating layer 22 remains inside the element isolation trench T.

Thereafter, hard mask layer 21 in FIG. 9 is selectively removed. Element isolation insulating layer 22 is etched back by using a dilute fluoric acid solution to expose a portion of the side surface of charge storage layer 14 (side surface on the upper surface side). At this point, a corner (see the section in the x direction of FIG. 10) E on the upper surface side of charge storage layer 14 is also etched back and thus, the corner E changes to a tapering or round shape.

Figure 11:
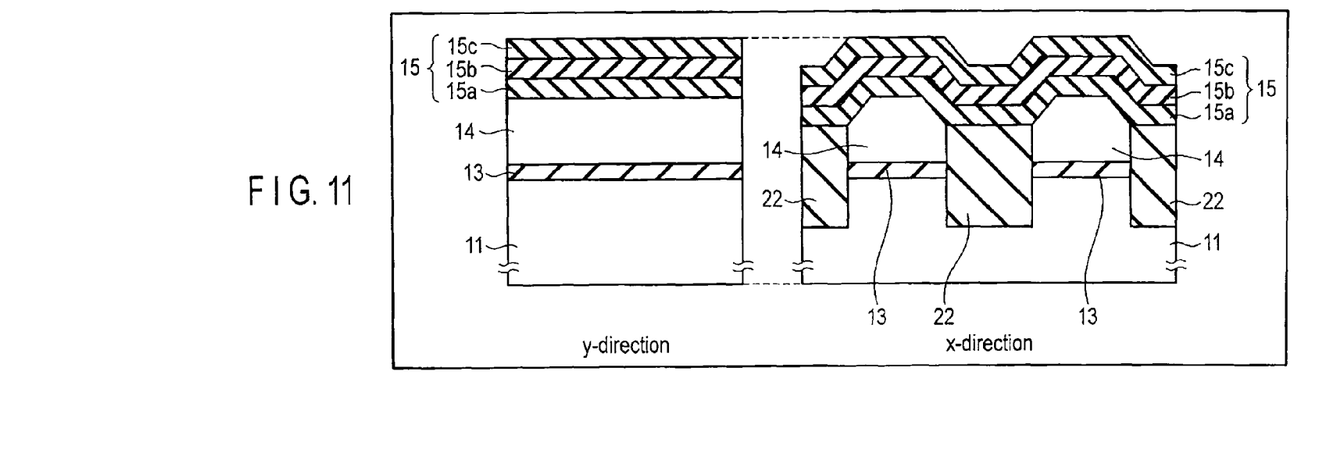

Next, as shown in FIG. 11, second insulating layer 15 as an inter-electrode insulating layer is formed on charge storage layer 14 by ALD (Atomic Layer Deposition).

In the present embodiment, second insulating layer 15 includes LaAlO$_3$ layer 15a having the physical thickness of about 4 nm, LaAlSiO layer 15b having the physical thickness of about 7.3 nm, and LaAlO$_3$ layer 15c having the physical thickness of about 4 nm. In this case, LaAlO$_3$ layer 15a, LaAlSiO layer 15b, and LaAlO$_3$ layer 15c are desirably formed successively in a vacuum.

Figure 12:
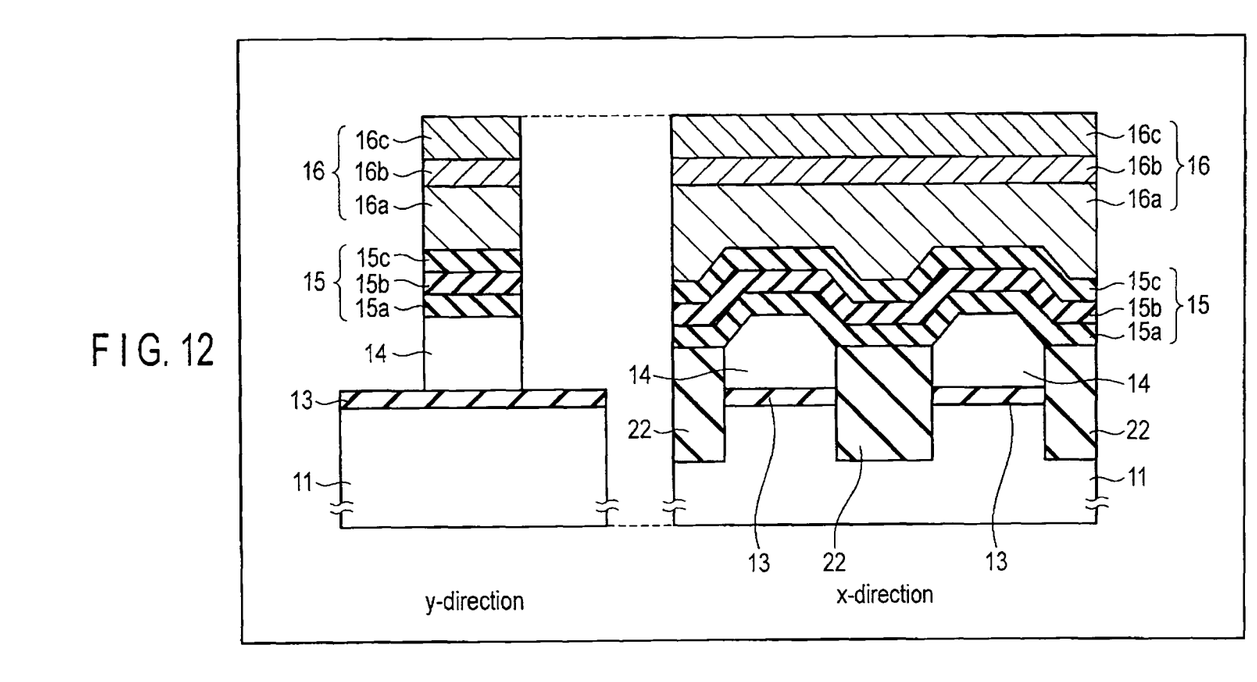

Next, as shown in FIG. 12, control gate electrode 16 having the physical thickness of about 100 nm on second insulating layer 15 by the CVD. In the present embodiment, control gate electrode 16 includes boron doped polysilicon layer 16a, tungsten nitride layer 16b, and tungsten layer 16c.

The cell transistor is completed by patterning control gate electrode 16, second insulating layer 15, and charge storage layer 14 by the PEP and RIE.

Figure 13:
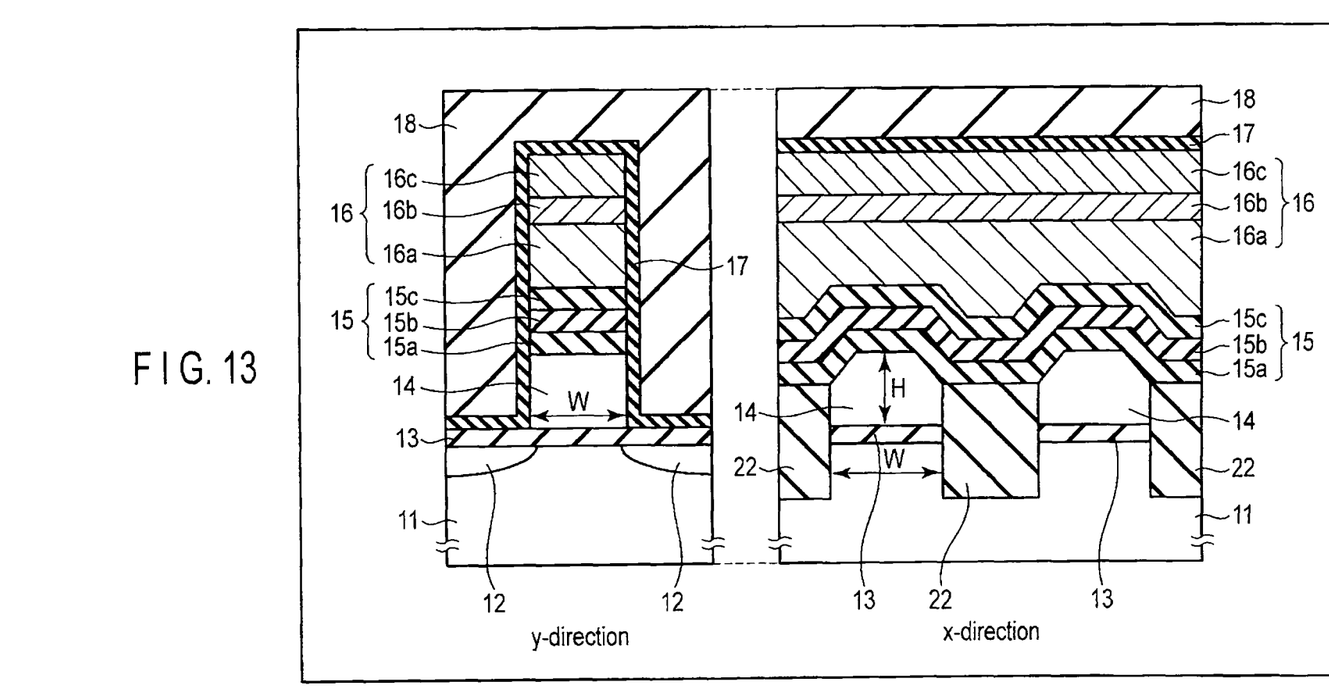

Next, as shown in FIG. 13, control gate electrode 16 of the cell transistor is used as a mask to inject impurities into semiconductor layer 11 by using ion implantation to form source/drain region 12. However, the formation of source/drain region 12 may be omitted. This is because if the cell transistor has an ever finer structure, a conduction path can be generated in the cell transistor without source/drain region 12 due to the fringe effect.

Lastly, after protective layer (for example, silicon nitride) 17 covering charge storage layer 14, second insulating layer 15, and control gate electrode 16 is formed, interlayer insulating layer (for example, silicon oxide) 18 covering the cell transistor is formed by the CVD.

In the above manufacturing method, the upper surface of charge storage layer 14 may be completely flat. If, for example, the upper surface of charge storage layer 14 is made approximately the same as the upper surface of element isolation insulating layer 22, a complete flat cell structure in which the area where semiconductor layer 11 and charge storage layer 14 are opposed and the area where charge storage layer 14 and control gate electrode 16 are opposed can be realized.

The present embodiment assumes, as descried above, the flat cell structure or a structure close thereto. In such a case, the ratio of a width W and a height H (aspect ratio H/W) of charge storage layer 14 is desirably 2 or less (see FIG. 13). The width W of charge storage layer 14 means a narrower width of the width in the x direction and the width in the y direction.

Figure 14:
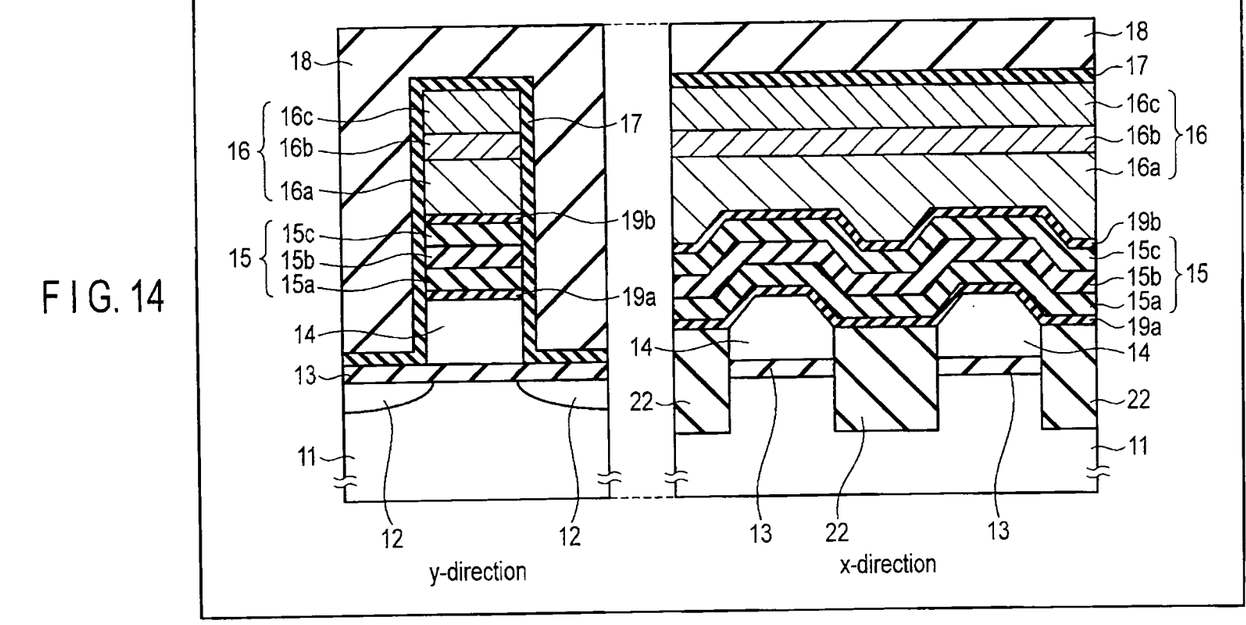

FIG. 14 shows a first modification of the above manufacturing method.

The present modification is characterized in that first interfacial layer 19a is formed between charge storage layer 14 and second insulating layer 15 and second interfacial layer 19b is formed between second insulating layer 15 and control gate electrode 16.

First interfacial layer 19a is a layer created by, for example, $LaAlO_3$ layer 15a reacting with an element in charge storage layer 14 or element isolation insulating layer 22. If charge storage layer 14 or element isolation insulating layer 22 contains Si, first interfacial layer 19a is, for example, an LaAlSiO layer.

Second interfacial layer 19b is a layer created by, for example, $LaAlO_3$ layer 15c reacting with an element in bottom layer 16a of control gate electrode 16. If bottom layer 16a contains Si, second interfacial layer 19b is, for example, an LaAlSiO layer.

Figure 15:
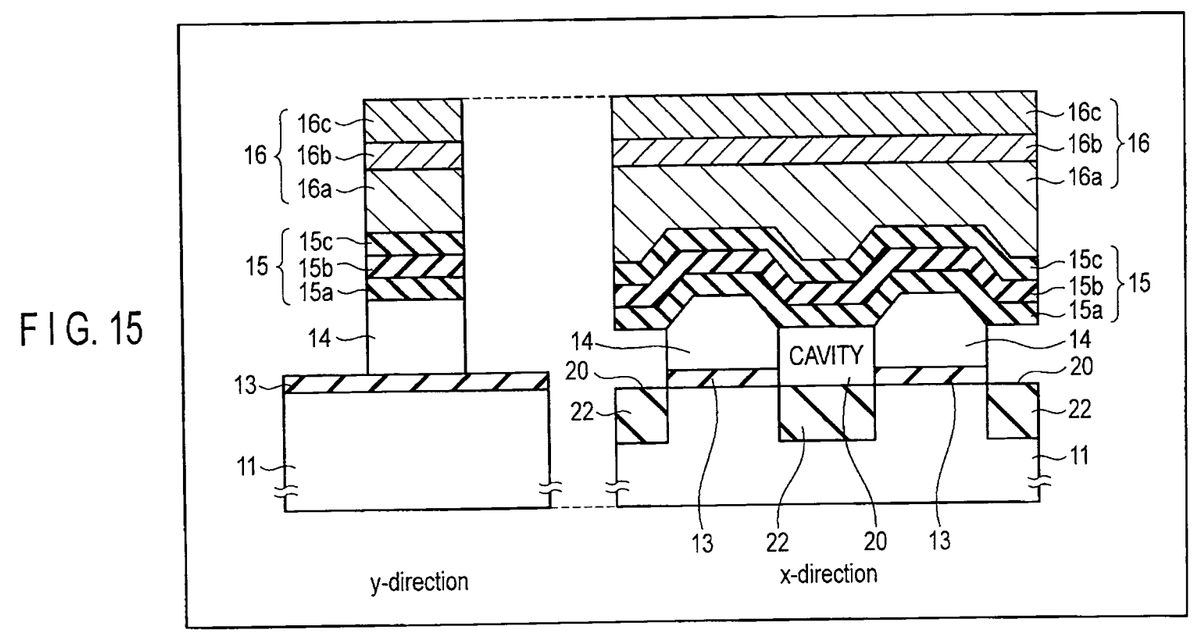
Figure 16:
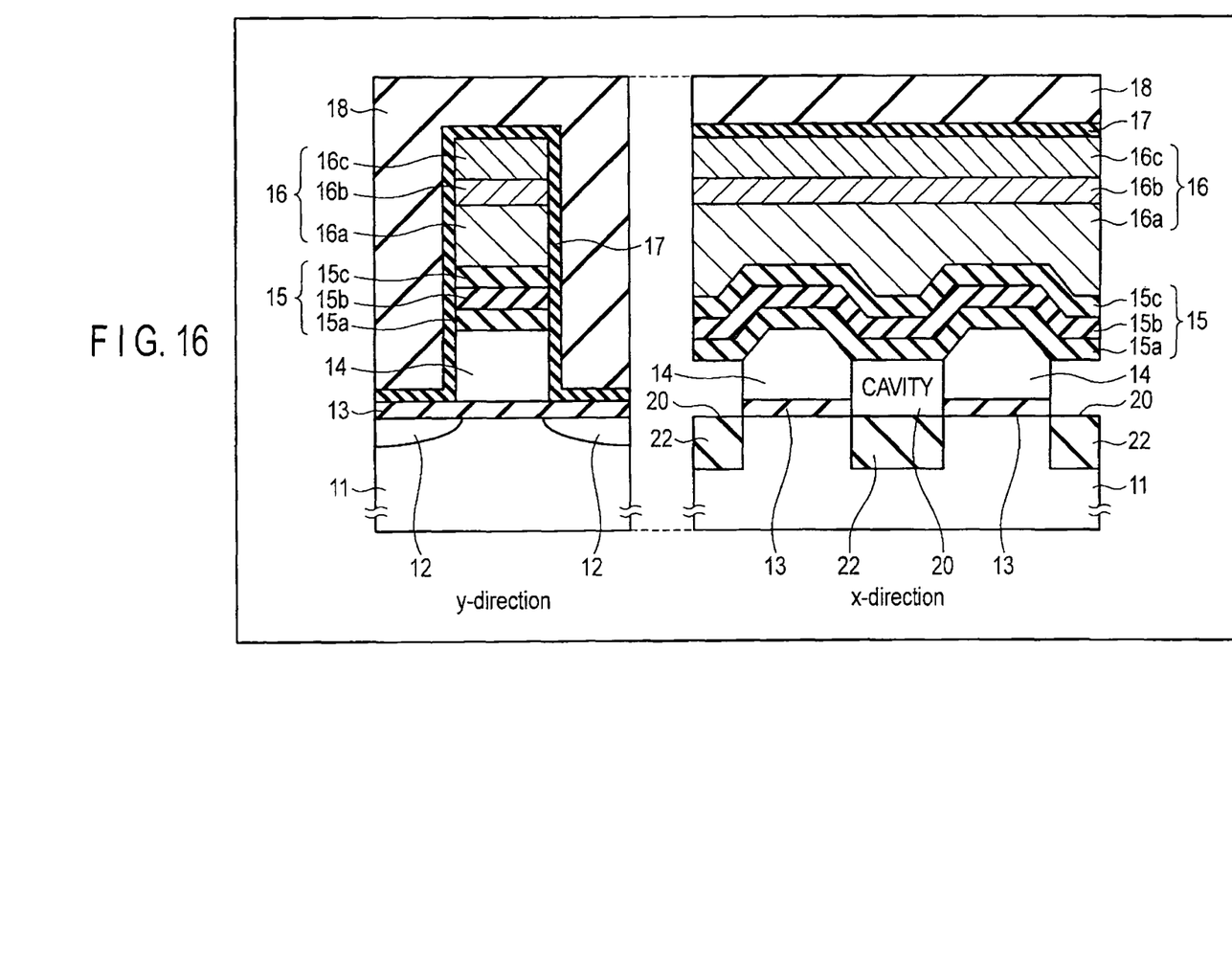

FIGS. 15 and 16 show a second modification of the above manufacturing method.

The present modification is characterized in that a portion of an element isolation region is air gap (cavity) 20.

First, as shown in FIG. 15, steps until the cell transistor is completed by patterning control gate electrode 16, second insulating layer 15, and charge storage layer 14 by the PEP and RIE are executed by the same method as the above manufacturing method (see FIGS. 6 to 12).

Subsequently, a chemical solution is supplied from a space on the side surface in the y direction of control gate electrode 16 onto element isolation insulating layer 22 to selectively etch element isolation insulating layer 22. As a result, element isolation insulating layer 22 above the upper surface of semiconductor layer 11 is mainly removed to form air gap (cavity) 20 between two charge storage layers 14.

Element isolation insulating layer 22 may be removed completely, but if at least air gap 20 is formed between two charge storage layers 14, a contribution can be made to improvement of the coupling ratio CPR through the reduction in parasitic capacitance generated in a cell transistor.

Next, as shown in FIG. 16, control gate electrode 16 of the cell transistor is used as a mask to inject impurities into semiconductor layer 11 by using ion implantation to form source/drain region 12. However, as described above, the formation of source/drain region 12 may be omitted.

Lastly, after protective layer (for example, silicon nitride) 17 covering charge storage layer 14, second insulating layer 15, and control gate electrode 16 is formed, interlayer insulating layer (for example, silicon oxide) 18 covering the cell transistor is formed by the CVD.

3. Application Example

The cell transistor in FIG. 1 can be applied to a memory cell of a nonvolatile semiconductor storage device such as a flash memory. For example, the present embodiment can be applied to a memory cell such as a binary/multi-valued NAND flash memory and a NAND flash memory in the three-dimensional structure.

While a memory cell is formed on a semiconductor substrate (for example, a silicon substrate) in a NAND flash memory of the two-dimensional structure, a memory cell is formed on a semiconductor layer on a semiconductor substrate (for example, a silicon pillar, silicon fin or the like) in a NAND flash memory of the three-dimensional structure. It is assumed that the semiconductor layer includes, in addition to the semiconductor layer on a semiconductor substrate, the semiconductor substrate.

With an increasing number of pieces of data one memory cell is caused to store, the margin between each piece of data (threshold) becomes smaller. Thus, it becomes important to control the threshold with precision by suppressing the leakage current during writing/erasing. According to the above embodiment, an increased coupling ratio and a decreased leakage current during writing/erasing are realized simultaneously and the present embodiment is particularly effective for a multi-valued nonvolatile semiconductor storage device.

4. Conclusion

According to the present embodiment, an increased coupling ratio and a decreased leakage current during writing/erasing are realized simultaneously.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising a first memory cell, the first memory cell comprising:
   a semiconductor layer;
   a first insulating layer on the semiconductor layer;
   a charge storage layer on the first insulating layer;
   a second insulating layer on the charge storage layer; and
   a control gate electrode on the second insulating layer,
   wherein the second insulating layer comprises a stacked structure provided in order of a first lanthanum aluminate layer, a lanthanum aluminum silicate layer and a second lanthanum aluminate layer from the charge storage layer side to the control gate electrode side, dielectric constants of the first and second lanthanum aluminate layers are higher than a dielectric constant of the lanthanum aluminum silicate layer, and
   energy band gaps between the charge storage layer and each of the first and second lanthanum aluminate layers are smaller than an energy band gap between the charge storage layer and the lanthanum aluminum silicate layer.

2. The memory of claim 1,
wherein the first insulating layer has an equivalent oxide thickness of 6 nm or more, and the second insulating layer has an equivalent oxide thickness of 4 nm or less.

3. The memory of claim 2,
wherein each of the first and second lanthanum aluminate layers has a physical thickness of 2 nm or more and 7 nm or less.

4. The memory of claim 2,
wherein each of the first and second lanthanum aluminate layers has a physical thickness of more than 7 nm, and a conditional expression $y > -13x + 84.25$ is satisfied, where x is a work function of the charge storage layer, and y is a dielectric constant of the first and second lanthanum aluminate layers.

5. The memory of claim 2,
wherein the first insulating layer has an equivalent oxide thickness of 7.5 nm or less.

6. The memory of claim 1,
wherein a composition ratio of La and Al of each of the first and second lanthanum aluminate layers is within a range from La:Al=2:1 to La:Al=1:4.

7. The memory of claim 1,
wherein each of the first and second lanthanum aluminate layers comprises $LaAlO_3$.

8. The memory of claim 1,
wherein the lanthanum aluminum silicate layer comprises LaAlSiO.

9. The memory of claim 4,
wherein the work function x is 5.05 eV or more, and the dielectric constant y is 19 or more.

10. The memory of claim 4,
wherein the work function x is 4.45 eV or more, and the dielectric constant y is 26.4 or more.

11. The memory of claim 1,
wherein a ratio of a width and a height of the charge storage layer is 2 or less.

12. The memory of claim 1, further comprising
an interfacial layer between the charge storage layer and the second insulating layer.

13. The memory of claim 12,
wherein the charge storage layer comprises Si, and the interfacial layer comprises LaAlSiO.

14. The memory of claim 1, further comprising
an interfacial layer between the second insulating layer and the control gate electrode.

15. The memory of claim 14,
wherein the control gate electrode comprises Si, and the interfacial layer comprises LaAlSiO.

16. The memory of claim 1, further comprising:
a second memory cell comprising a charge storage layer; and
a cavity between the charge storage layers of the first and second memory cells.

17. The memory of claim 1,
wherein an upper edge of the charge storage layer is more circular than a lower edge of the charge storage layer, seen from a sectional view along a line which is perpendicular to a channel length.

18. The memory of claim 1,
wherein the semiconductor layer is one selected from a group of a semiconductor substrate, a semiconductor pillar and a semiconductor fin.

19. The memory of claim 1,
wherein the charge storage layer stores multi level data of 3 levels or more.

20. A method of manufacturing the memory of claim 1, the method comprising:
forming the first insulating layer on the semiconductor layer;
forming the charge storage layer on the first insulating layer;
forming the second insulating layer on the charge storage layer by using ALD method; and
forming the control gate electrode on the second insulating layer,
wherein the first lanthanum aluminate layer, the lanthanum aluminum silicate layer and the second lanthanum aluminate layer is continuously formed in vacuum.

* * * * *